(12) United States Patent
Kim

(10) Patent No.: US 7,030,475 B2
(45) Date of Patent: Apr. 18, 2006

(54) METHOD AND APPARATUS FOR FORMING A THIN FILM

(75) Inventor: Do-Hyung Kim, Seoul (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 10/744,358

(22) Filed: Dec. 23, 2003

(65) Prior Publication Data

US 2004/0173152 A1 Sep. 9, 2004

(30) Foreign Application Priority Data

Feb. 17, 2003 (KR) .................. 10-2003-0009927

(51) Int. Cl.
*H01L 23/02* (2006.01)
(52) U.S. Cl. ............................................... 257/678
(58) Field of Classification Search ............. 438/786, 438/783, 779, 778, 761, 789, 788, 784, 695, 438/710; 427/255.17; 257/678
See application file for complete search history.

(56) References Cited

U.S. PATENT DOCUMENTS

| | | | |
|---|---|---|---|
| 5,221,556 A | * | 6/1993 | Hawkins et al. ....... 427/255.17 |
| 6,184,158 B1 | * | 2/2001 | Shufflebotham et al. .... 438/788 |
| 6,200,911 B1 | | 3/2001 | Narwankar et al. ......... 438/758 |
| 6,468,927 B1 | * | 10/2002 | Zhang et al. ............... 438/779 |

FOREIGN PATENT DOCUMENTS

| | | |
|---|---|---|
| JP | 2002-43311 | 2/2002 |
| KR | 2002-0022579 | 3/2002 |

* cited by examiner

*Primary Examiner*—Carl Whitehead, Jr.
*Assistant Examiner*—Monica D. Harrison
(74) *Attorney, Agent, or Firm*—Mills & Onello, LLP

(57) ABSTRACT

In a method of uniformly forming a thin film on a wafer and an apparatus of using the same, after supplying a first gas, a second gas and a third gas into a reaction chamber in which a wafer is loaded, a thin film is formed on the wafer from the first gas and the second gas. The third gas stabilizes the second gas. A wafer holder is disposed in the reaction chamber. A gas-supplying unit extended to the reaction chamber supplies more gas to the central portion of the wafer than to a peripheral portion of the wafer. The contaminant particles formed from the second gas are removed by using the gas-supplying unit and the third gas. The first gas is supplied more at the central portion of the wafer than at a peripheral portion of the wafer, thereby forming a thin film of high quality on the wafer.

7 Claims, 14 Drawing Sheets

METHOD AND APPARATUS FOR FORMING A THIN FILM

RELATED APPLICATIONS

The present application claims priority from Korean Patent Application No. 2003-09927, filed on Feb. 17, 2003, the contents of which are hereby incorporated herein by reference in their entirety.

BACKGROUND OF THE INVENTION

1. Field of the Invention

The present invention relates to a method and an apparatus for forming a thin film uniformly on a wafer with improved characteristics, and more particularly, to a method of producing plasma from a first gas and a second gas to form a layer on a wafer while contaminant particles produced from the second gas are removed to form a thin film uniformly on the wafer with improved characteristics and an apparatus for performing the same.

2. Description of the Related Art

Recent advances in semiconductor devices tend to be in high integration and high performance for processing more data in a shorter time. To manufacture highly integrated high-performance semiconductor devices, a technique of depositing a thin film precisely on a semiconductor substrate is important.

Generally, techniques of depositing a thin film on a wafer can be divided into physical vapor deposition (PVD) using a physical method and chemical vapor deposition (CVD) using a chemical method.

In physical vapor deposition, a heater is installed and a source material is placed on the heater. A source material is disposed in an upper portion of a chamber under a high vacuum condition. The wafer separated from the heater is disposed in the chamber. When the heater heats a source material to a high temperature, the source material evaporates and is consolidated on the wafer to form a thin film.

In physical vapor deposition, metal particles are separated from a target to form a metal thin film using an argon gas ionized by a high voltage. However, physical vapor deposition is used in limited processes because it typically results in formation of a non-uniform film.

In chemical vapor deposition, a semiconductor layer or an insulating layer of a single crystal is formed on a surface of the wafer using a chemical reaction of a source material. The chemical vapor deposition may be a low-pressure chemical vapor deposition (LPCVD), an atmospheric pressure chemical vapor deposition (APCVD), a plasma enhanced chemical vapor deposition (PECVD) and a high-pressure chemical vapor deposition (HPCVD), according to a pressure in a chamber. Chemical vapor deposition is used to deposit thin films such as an amorphous silicon layer, a silicon oxide layer, a silicon nitride layer or a silicon oxynitride layer on the wafer.

In plasma enhanced chemical vapor deposition, electrons of high energy collide with the neutral gas molecules to decompose the gas molecules, and the thin film is deposited by using deposition of decomposed gas atoms on a semiconductor substrate. Plasma is formed from a precursor gas in a chamber while depositing the thin film at a relatively high deposition rate at a low temperature. However, in chemical vapor deposition, when step coverage of the thin film is not good, voids may be formed in the thin film. As the depositing process progresses and the gap between patterns decreases, the voids increase. The voids formed in the thin film cause many problems such as deteriorating characteristics of the thin film and increased failures of subsequent processes.

In order to solve the problems of the plasma enhanced chemical vapor deposition method, a chemical vapor deposition using a high-density plasma chemical vapor deposition (HDP-CVD) has been used. In the high density plasma chemical vapor deposition, as an etching process using sputtering is performed while depositing the thin film, the thin film is formed without voids in a gap of high aspect ratio. However, when a gap width is shortened or multiple thin film depositions are performed, the HDP-CVD also may not fill up the gap without the voids because silicon oxide etched during the sputtering process is re-deposited. When silicon oxide is re-deposited, an overhang structure in the silicon oxide layer is formed. The overhang structure may form the voids in the thin film. The overhang structure is disposed on a corner of the pattern. Recently, a number of process steps such as adding an etching gas to a source gas and controlling temperature of the wafer are performed to solve the problems of HDP-CVD.

FIG. 1A is a Scanning Electron Microscope (SEM) image illustrating a cross-sectional view of an oxide layer according to a conventional method of an HDP-CVD of adding an etching gas, when a bias power of about 700 W was applied to form an oxide layer on a central portion of a wafer, and FIG. 1B is a Scanning Electron Microscope (SEM) image illustrating a cross-sectional view of an oxide layer according to a conventional method of an HDP-CVD of adding an etching gas, when a bias power of about 700 W was applied to form an oxide layer on a peripheral portion of a wafer.

Referring to FIGS. 1A to 1B, when a bias power of about 700 W is supplied, voids and porous layers 13, 14 are formed on each of the thin film patterns of a central portion and a peripheral portion of a wafer to deteriorate gap fill characteristics of a thin film. An upper portion 15, 16 of the deposited thin films on the central portion and the peripheral portion of the wafer are non-uniform, and the thin film deposited on the central portion is more uniform than the thin film deposited on the peripheral portion. The films having the non-uniformity cause numerous defects.

FIG. 2A is a Scanning Electron Microscope (SEM) image illustrating a cross-sectional view of an oxide layer according to a conventional method of an HDP-CVD of adding an etching gas, when a bias power of about 900 W was applied to form an oxide layer on a central portion of a wafer, and FIG. 2B is a Scanning Electron Microscope (SEM) image illustrating a cross-sectional view of an oxide layer according to a conventional method of an HDP-CVD of adding an etching gas, when a bias power of about 900 W was applied to form an oxide layer on a peripheral portion of a wafer.

Referring to FIGS. 2A to 2B, when a bias power of about 900 W is supplied, voids and porous layers are not formed on a central portion of a wafer, thereby having good gap fill characteristics. An upper portion 25 of the thin film is uniform. However, voids and porous layers are formed on a peripheral portion 22 of a wafer. The gap fill characteristics of FIG. 2B are better than the gap fill characteristics of FIG. 1B. But, the thin film of FIG. 2B may also cause defects.

FIG. 3A is a Scanning Electron Microscope (SEM) image illustrating a cross-sectional view of an oxide layer according to a conventional method of an HDP-CVD of adding an etching gas, when a bias power of about 1,100 W was applied to form an oxide layer on a central portion of a wafer, and FIG. 3B is a Scanning Electron Microscope (SEM) picture illustrating a cross-sectional view of an oxide layer according to a conventional method of an HDP-CVD of adding an etching gas, when a bias power of about 1,100 W was applied to form an oxide layer on a peripheral portion of a wafer.

As shown in FIGS. 1A to 3B, in accordance with a conventional method of an HDP-CVD of adding an etching gas, the gap filling characteristics are greatly varied according to an increase in the bias power.

Referring to FIGS. 1A and 1B, when a bias power of about 700 W is applied, voids are formed in each thin film formed in a central portion 11 and a peripheral portion 12 of the wafer. Further, porous thin films are formed in the central portion 11 and the peripheral portion 12. Thus, unpreferable gap-filling characteristics are shown. The upper portions 15, 16 of the thin film formed in the central portion 11 and a peripheral portion 12 of the wafer shows non-uniformity that increases from the central portion 11 towards the peripheral portion 12. The thin films as shown in FIGS. 1A and 1B are inadequate for use and thus discarded.

When a bias power of about 900 W is applied, no void is formed in each film formed in the central portion 21 as shown in FIG. 2A. Also, no porous film is formed in the central portion and the upper portion. 25 of thus formed thin film shows uniformity. Thus, good gap-filling characteristics are shown. However, as shown in FIG. 2B, voids are formed in the thin film formed in the peripheral portion 22 of the wafer. Also, a porous film is formed in the peripheral portion 22. Further, the uniformity of the upper portion 26 of the deposited thin film is better than the thin layer as shown in FIG. 1B. However, the upper portion 26 is somewhat non-uniform in thickness and thus may induce a failure in a subsequent process.

Referring to FIGS. 3A to 3B, when a bias power of about 1,100 W is applied, voids and porous layers are not formed in each of the thin film patterns of a central portion 31 and a peripheral portion 32 of a wafer to have good gap filling characteristics. Upper portions 35, 36 of the thin films formed on the central portion 31 and the peripheral portion 32 of the wafer are uniform. However, an upper portion 33 of a predetermined layer disposed under the thin film is over-etched, thereby generating a clipping phenomenon.

Generally, when the deposition process is performed on the patterns having a short gap width and a number of thin films is increased, silicon oxide etched by sputtering is re-deposited on a peripheral region of the patterns. Since the re-deposition causes generation of the voids in the thin film, a proper bias power suitable for filling the gap is applied to the patterned region having the gap. However, when a bias power is increased to more than a predetermined power, a corner of a silicon oxide layer is over-etched in a direction of about 45 degrees to cause the clipping phenomenon. Therefore, improvement in layer characteristics by increasing the bias power is limited.

An apparatus for performing a chemical vapor deposition process comprises a reaction chamber in which gases are chemically reacted with each other. A dielectric layer, a conductive layer or an insulating layer is deposited on a substrate using a gas reaction in the reaction chamber. During the deposition process of the thin film, not only is the thin film formed on a substrate, but the thin film is also formed on various structures such as a masking structure in the reaction chamber or a substrate-supporting structure, thereby forming contaminant particles in the reaction chamber. During a subsequent deposition process of the thin film, a crack is formed in the layer and the layer is peeled off so that the contaminant particles may drop on the substrate. The layer is formed on the inner wall of the reaction chamber or the various structures. In order to improve deposition efficiency, the reaction chamber is cleaned regularly to remove the contaminant particles. The cleaning is performed by means of introducing an etching gas having fluorine such as trifluoro-nitrogen ($NF_3$). The fluorine etches silicon, silicon oxide, etc., using an ion impact of a plasma reaction to remove the contaminants deposited on the inner wall of the reaction chamber. However, after the cleaning, fluorine contaminants remain in the reaction chamber to degrade the quality of the thin film that is subsequently deposited. For example, voids may be formed in an amorphous silicon thin film formed on a silicon nitride layer. In order to reduce damage caused by the fluorine contaminants, a length of a nozzle that supplies,the etching gas is controlled and an amount of a power supply is increased. However, the control of the length and the increment of the power supply cause a formation of non-uniform thin film on the wafer.

FIG. 4 is a sectional view illustrating an HDP-CVD apparatus, and FIG. 5 is a partial perspective view illustrating an enlarged gas-supplying unit of the HDP-CVD apparatus in FIG. 4.

Referring to FIGS. 4 and 5, the conventional HDP-CVD comprises a reaction chamber 10, a wafer holder 30 for supporting a wafer 40, an electrostatic chuck 20 installed on the wafer holder 30, a reaction gas-supplying tube 50 and a purge gas-supplying tube 60.

An upper portion of the reaction chamber 10 has a dome shape, and a radio frequency (RF) coil 80 is disposed on an outer portion of the reaction chamber 10. The wafer holder 30 is disposed on an inside of the reaction chamber 10, and the electrostatic chuck 20 is installed on the wafer holder 30. The reaction gas-supplying tube 50 is disposed on the inside of the reaction chamber 10. The reaction gas-supplying tube 50 is disposed on the reaction chamber 10 relative to a central axis of the electrostatic chuck 40 in regular intervals. Generally, a reaction gas-supplying tube 50 supplies a source gas for depositing a thin film and an etching gas for improving deposition efficiency. A purge gas-supplying tube 60 is disposed below the reaction gas-supplying tube 50. The reaction gas-supplying tube 50 is a tube having a predetermined diameter, and a nozzle is inclined toward a center of the upper portion of the reaction chamber 10. A vacuum pump 70 is disposed on a side of the reaction chamber 10.

When the wafer 40 is mounted on the electrostatic chuck 20, the vacuum pump 70 controls a pressure in the reaction chamber 10. A reaction gas for depositing the thin film is supplied through the reaction gas-supplying tube 50. In order to improve the deposition efficiency, the etching gas is supplied together with the reaction gas. After the reaction gas and the etching gas are supplied into the reaction chamber 10, a bias power from an RF power-supplying unit is supplied to the wafer holder 30. When the bias power is supplied, plasma is formed in the reaction chamber 10 and the thin film is deposited on the wafer 40.

An interval between patterns of a thin film formed on a semiconductor substrate decreases according to a high integration and a high performance of a semiconductor device. As the interval between the patterns decreases, the deposition efficiency is deteriorated. Therefore, an etching gas is needed. Generally, a gas having fluorine is used as the etching gas. However, the fluorine residues remain in the reaction chamber to deteriorate characteristics of the thin film formed on the wafer. Also, contaminants formed by means of an etching gas are deposited on an inside wall of the reaction chamber and structures (or parts) in the reaction chamber such as a cover or a substrate supporting structure to form contaminant particles. During the subsequent deposition process of the thin film, a crack is formed in the contaminant particles deposited on the inner wall of the reaction chamber or the contaminant particles are removed from the inner wall. Therefore, the contaminant particles may drop on the substrate, and the semiconductor device may become damaged or defective.

In order to reduce the damage or the defects, a length of the etching gas-supplying tube is preferably shortened and the bias power is preferably increased. However, when the length of the etching gas-supplying tube is shortened, the thin film on the wafer is formed non-uniformly. Also, when the bias power increases, energy of high-density plasma is also increased to non-uniformly etch the thin film on the wafer. Over-etching causes re-deposition and clipping. Also, an over-etched portion and under-etched portion are formed on the wafer, thereby causing problems in subsequent processes.

SUMMARY OF THE INVENTION

In an exemplary embodiment of the present invention, the present invention provides a method of forming a thin film by converting contaminant particles generated from gases into another stable composition to deposit a thin film of high quality uniformly on a wafer with improved characteristics.

In another exemplary embodiment of the present invention, the present invention provides an apparatus for depositing a thin film by supplying gases to deposit the thin film to have a uniform thickness.

In another exemplary embodiment of the present invention, the present invention provides an apparatus for depositing a thin film by supplying gases for depositing the thin film, and converting contaminant particles generated from the gases for improving characteristics of a thin film to another stable composition to deposit a thin film of high quality on a wafer uniformly, in which a flow rate of the gas for depositing the thin film at a central portion of a semiconductor substrate is greater than at a peripheral portion of the semiconductor substrate.

According to a method of the invention, first gas for forming a thin film on a semiconductor substrate, a second gas for improving characteristics of the thin film, and a third gas for stabilizing the second gas are supplied onto a semiconductor substrate. The thin film is then formed on the semiconductor substrate using a plasma gas of the first gas and a plasma gas of the second gas.

The first gas may be at least one gas such as a silicon-containing gas, an oxygen-containing gas, a nitrogen-containing gas and an inert gas. The second gas may include a fluorine-containing gas, and the third gas may include a hydrogen-containing gas. An oxide layer or a nitride layer may be uniformly formed on the semiconductor substrate.

The first gas may include at least one of a silane gas, an oxygen gas, a nitrous oxygen gas, a nitrogen gas, a helium gas and an argon gas. The second gas may include a trifluoro-nitrogen gas. The third gas may include a hydrogen gas.

The forming of the thin film may include forming an oxide layer or a nitride layer on the semiconductor substrate.

In one embodiment, the flow rate of the first gas at a central portion of the semiconductor substrate is greater than that at a peripheral portion of the semiconductor substrate.

The apparatus for depositing a thin film comprises a reaction chamber, a wafer holder for supporting a wafer, and a gas-supplying unit extended into the reaction chamber to supply a gas. The flow rate of the supplied gas at the central portion of the wafer is higher than that at a peripheral portion of the wafer. The wafer holder is disposed in the reaction chamber.

The gas-supplying unit includes at least one injector. The injector extends into the interior of the reaction chamber. In another exemplary embodiment of the present invention, a plurality of first injectors adjacent to the peripheral portions of the wafer and extending into the interior of the reaction chamber, and a plurality of second injectors adjacent to the central portion of the wafer and extending into the interior of the reaction chamber are formed, and an interval between the first injectors and the peripheral portion of the wafer is shorter than an interval between the second injectors and the central portion of the wafer. At least one of the first injectors and at least one of the second injectors form at least one injector unit, and a plurality of injector units can be disposed in the interior of the chamber.

Another apparatus in accordance with the invention for depositing a thin film comprises a reaction chamber, a wafer holder disposed in the reaction chamber for supporting a wafer, and gas-supplying unit disposed in the reaction chamber for supplying the reaction chamber with a first, a second and a third gas. The first gas forms a thin film on the wafer, the second gas improves characteristics of the thin film, and the third gas stabilizes the second gas.

In one embodiment, the gas-supplying unit includes a plurality of first injectors for supplying at least one of the first gas, the second gas and the third gas, and a plurality of second injectors for supplying at least one of the first gas, the second gas and the third gas.

An injector unit comprises at least one of the first injectors and at least one of the second injectors. A plurality of the injector units is installed along an inner face of the reaction chamber. An interval between the first injectors and the peripheral portion of the wafer is shorter than an interval between the second injectors and the central portion of the wafer.

In one embodiment, the first gas includes at least one of a silicon-containing gas, an oxygen-containing gas, a nitrogen-containing gas and an inert gas. The second gas can include a fluorine-containing gas, and the third gas can include a hydrogen-containing gas. The first gas can include at least one of a silane gas, an oxygen gas, a nitrous oxygen gas, a nitrogen gas, a helium gas and an argon gas. The second gas can include a trifluoro-nitrogen gas. The third gas can include a hydrogen gas.

According to the present invention, contaminant particles from the gas for improving characteristics of the thin film are converted to another stable composition, thereby improving the characteristics of the thin film formed on a semiconductor substrate and depositing the thin film with a uniform thickness by supplying a gas at a flow rate of the gas at a central portion of a semiconductor substrate being greater than that at a peripheral portion of the semiconductor substrate. Also, the characteristics of the thin film formed on a semiconductor substrate are improved to reduce a defective proportion of subsequent processes.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF EXEMPLARY EMBODIMENTS

Figure 1A:
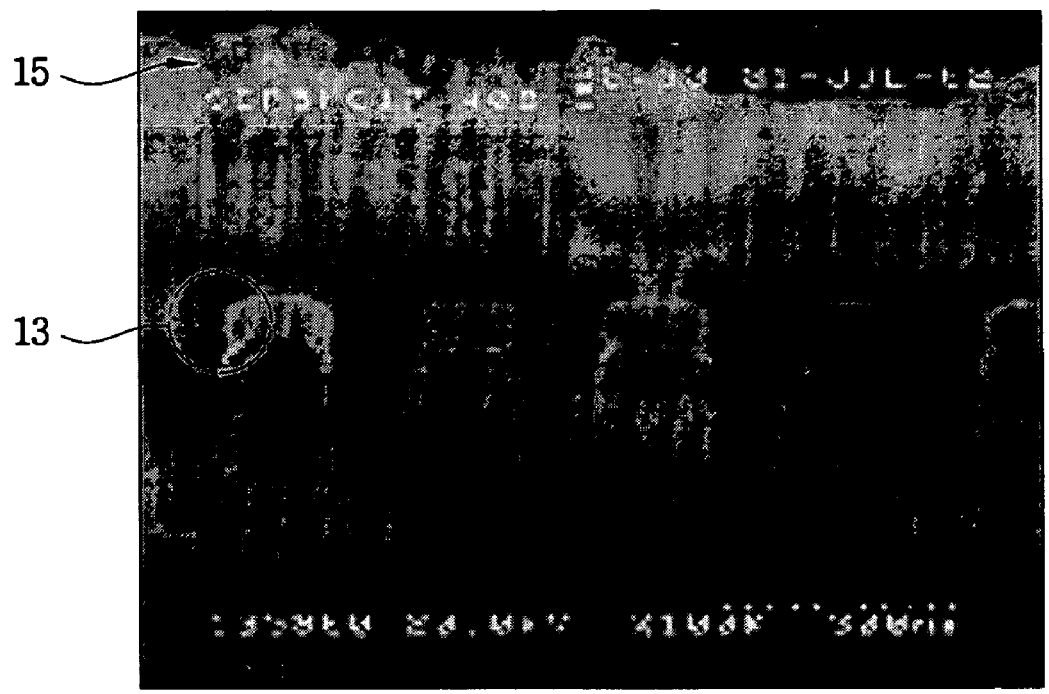
FIG. 1A is a Scanning Electron Microscope (SEM) image illustrating a cross-sectional view of an oxide layer according to a conventional method of an HDP-CVD of adding an etching gas, when a bias power of about 700 W is applied to form an oxide layer on a central portion of a wafer.
Figure 1B:
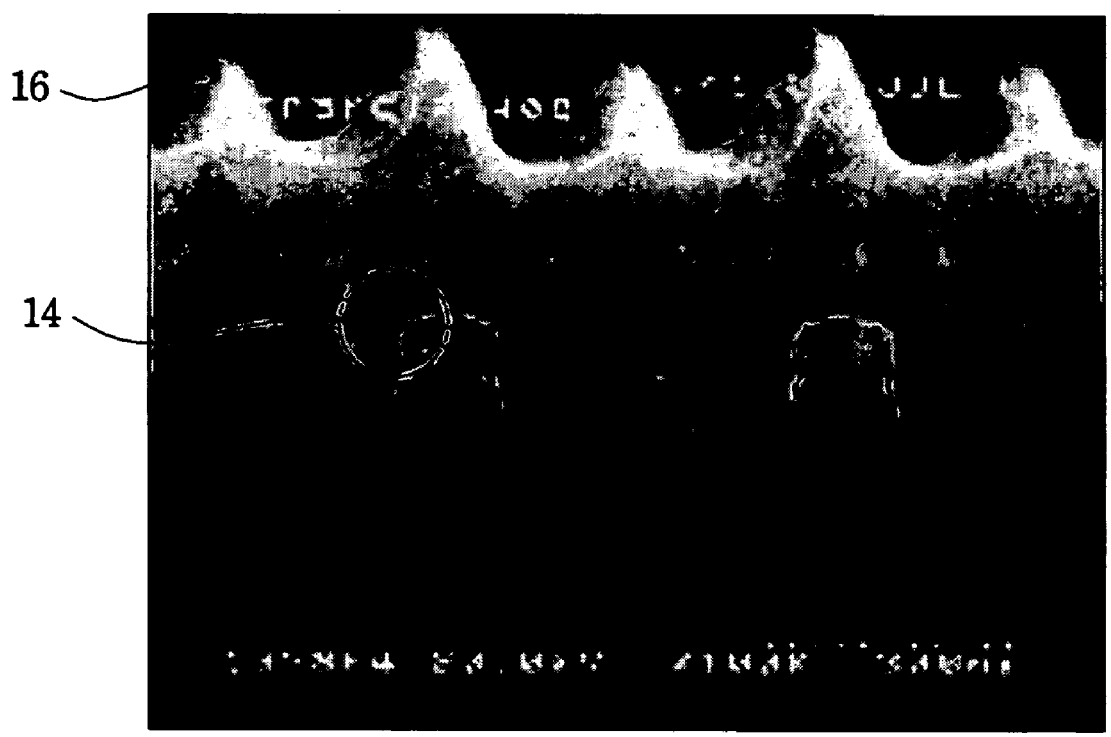
FIG. 1B is a Scanning Electron Microscope (SEM) image illustrating a cross-sectional view of an oxide layer according to a conventional method of an HDP-CVD of adding an etching gas, when a bias power of about 700 W is applied to form an oxide layer on a peripheral portion of a wafer.
Figure 2A:
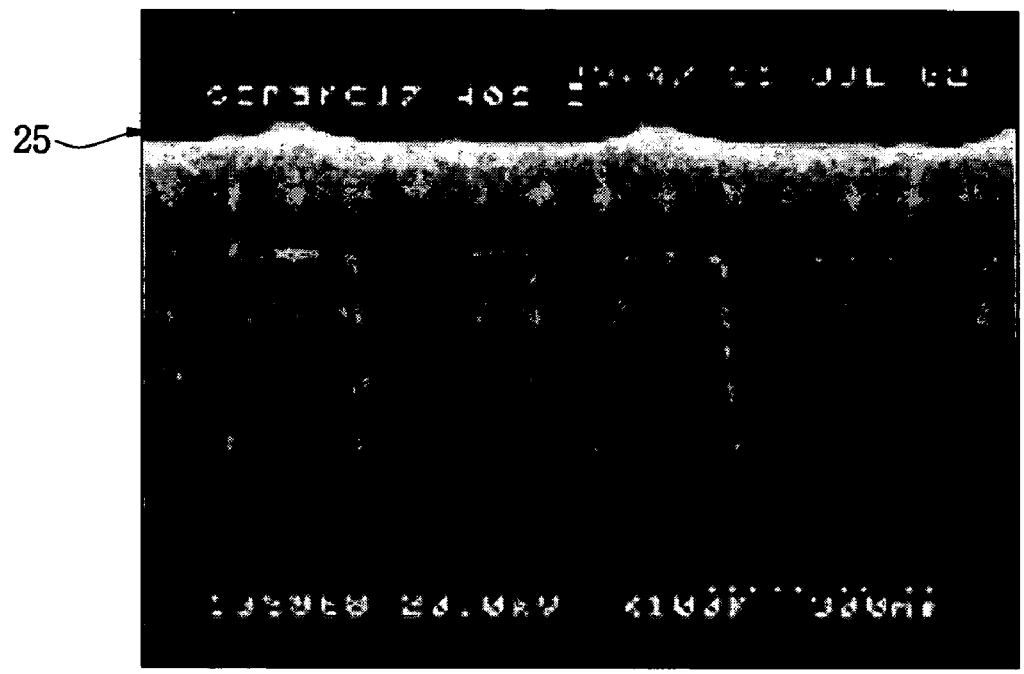
FIG. 2A is a Scanning Electron Microscope (SEM) image illustrating a cross-sectional view of an oxide layer according to a conventional method of an HDP-CVD of adding an etching gas, when a bias power of about 900 W is applied to form an oxide layer on a central portion of a wafer.
Figure 2B:
FIG. 2B is a Scanning Electron Microscope (SEM) image illustrating a cross-sectional view of an oxide layer according to a conventional method of an HDP-CVD of adding an etching gas, when a bias power of about 900 W is applied to form an oxide layer on a peripheral portion of a wafer.
Figure 3A:
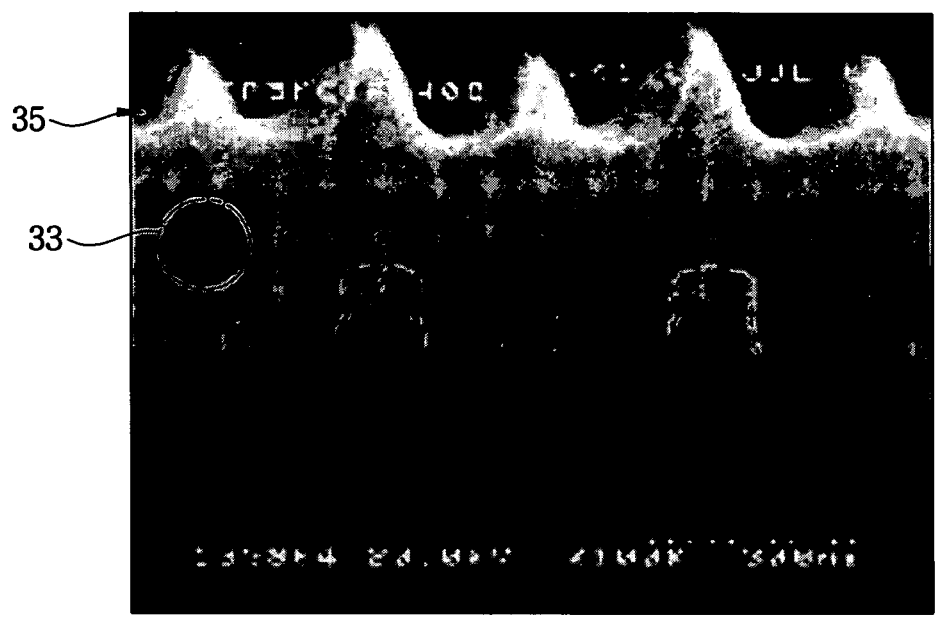
FIG. 3A is a Scanning Electron Microscope (SEM) image illustrating a cross-sectional view of an oxide layer according to a conventional method of an HDP-CVD of adding an etching gas, when a bias power of about 1,100 W is applied to form an oxide layer on a central portion of a wafer.
Figure 3B:
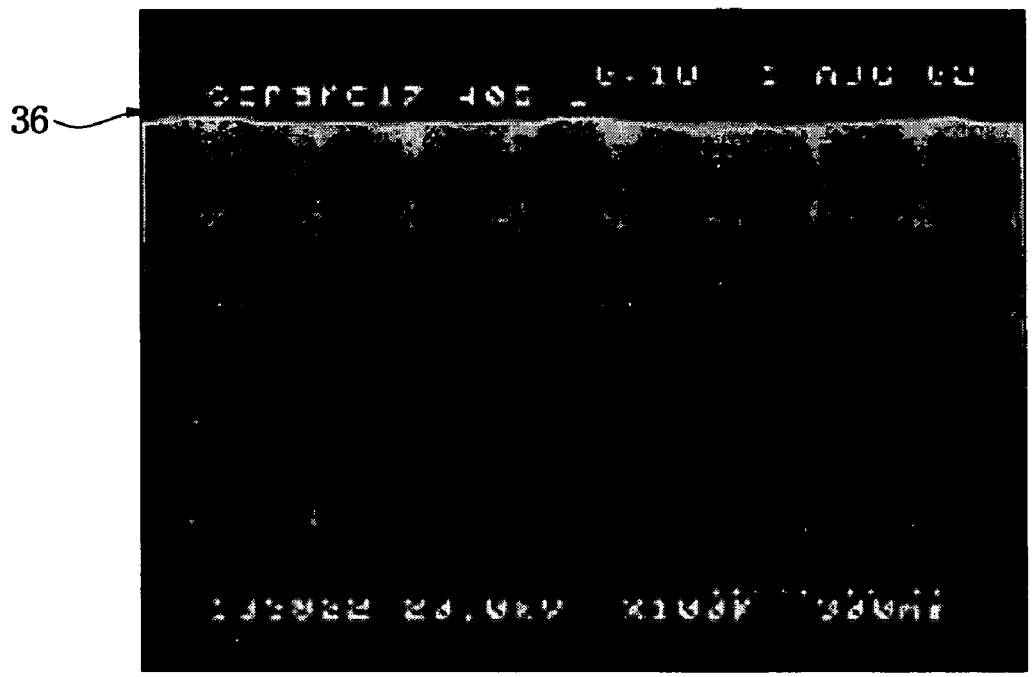
FIG. 3B is a Scanning Electron Microscope (SEM) image illustrating a cross-sectional view of an oxide layer according to a conventional method of an HDP-CVD of adding an etching gas, when a bias power of about 1,100 W is applied to form an oxide layer on a peripheral portion of a wafer.
Figure 4:
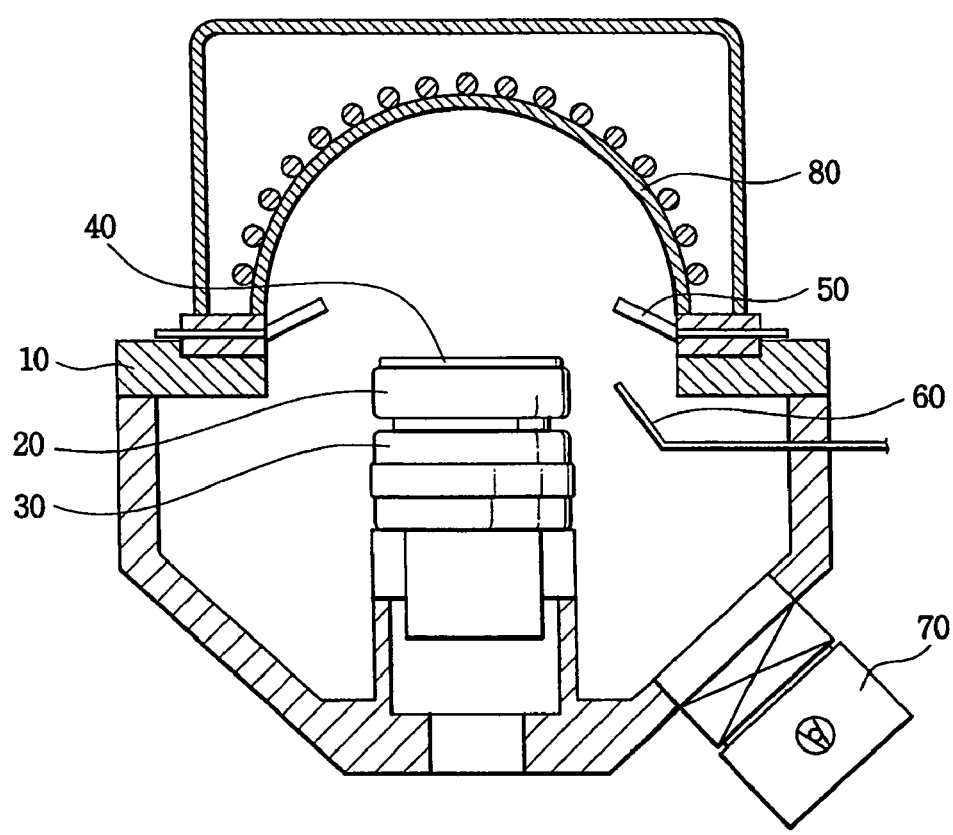
FIG. 4 is a sectional view illustrating an HDP-CVD.
Figure 5:
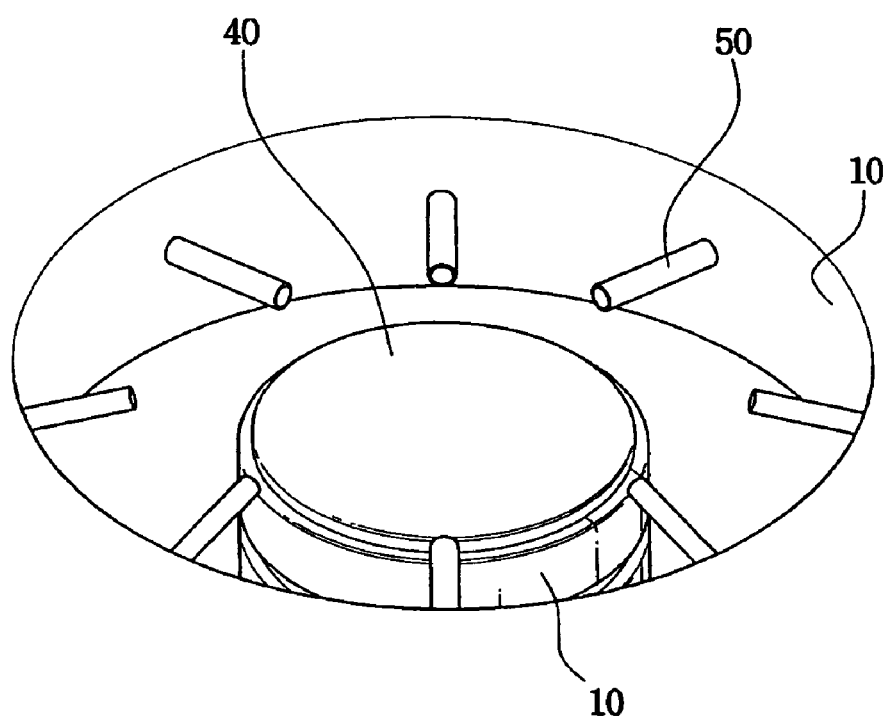
FIG. 5 is a partial perspective enlarged view illustrating an gas-supplying unit of the HDP-CVD of FIG. 4.
Figure 6:
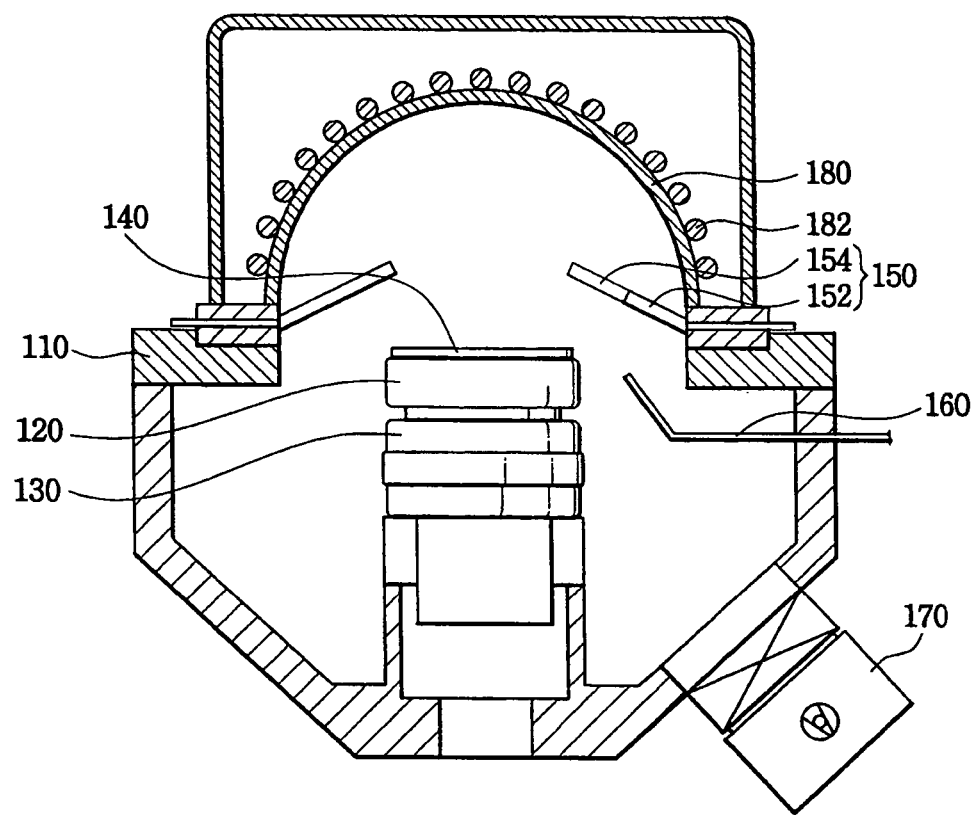
FIG. 6 is a sectional view illustrating an apparatus for depositing a thin film according to the exemplary method of the present invention.
Figure 7:
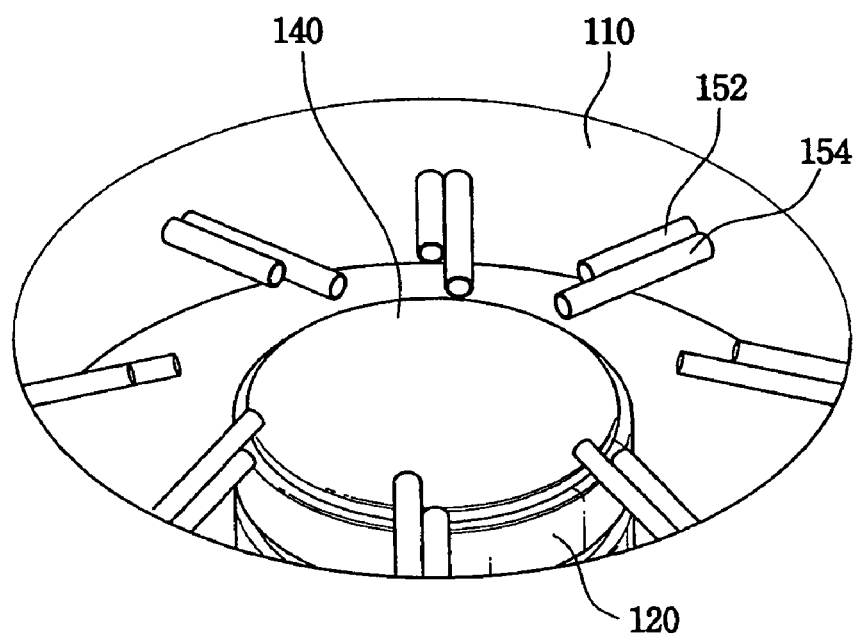
FIG. 7 is a partial perspective enlarged view illustrating an gas-supplying unit of the apparatus of FIG. 6.

FIG. 6 is a sectional view illustrating an apparatus for depositing a thin film according to the exemplary method of the present invention, and FIG. 7 is a partial enlarged perspective view illustrating a gas-supplying unit of the apparatus of FIG. 6.

Referring to FIGS. 6 and 7, the apparatus for forming a thin film of the exemplary embodiment of the present invention comprises a reaction chamber 110, a wafer holder 130 disposed in the reaction chamber 110 for supporting a wafer 140, and gas-supplying unit 150 extended into the reaction chamber 110 to supply a gas. The supplied amount of the gas to the central portion of the wafer 140 is greater than that to a peripheral portion of the wafer 140.

An upper portion of the reaction chamber 110 includes a dome shaped housing 180, and a radio frequency (RF) coil 182 is disposed on an outer portion of the housing 180. The radio frequency coil 182 provides the reaction chamber 110 with a radio frequency power.

The wafer holder 130 is disposed at a center in the reaction chamber 110, and an electrostatic chuck 120 is installed on the wafer holder 130. A wafer 140 is disposed on the electrostatic chuck 120. A bias power having substantially the same frequency as that supplied from the radio frequency coil 182 is supplied to the wafer holder 140. In one particular exemplary embodiment, the frequency of the bias power is about 13.56 MHz.

In order to control a predetermined pressure in the reaction chamber, a vacuum pump 170 is disposed on a side of the reaction chamber 110, and a purge gas tube 160 is disposed adjacent to the vacuum pump 170 to supply the reaction chamber 110 with a purge gas. The vacuum pump 170 is selectively utilized according to a process performed in the reaction chamber 110.

The gas-supplying unit 150 comprises a first injector 152 extended from the inner wall of the reaction chamber 110 towards a position adjacent to the peripheral portion of the wafer 140 and a second injector 154 extended from the inner wall of the reaction chamber 110 towards a position adjacent to the central portion of the wafer 140.

The first injectors 152 and the second injectors 154 have a tubular shape. The second injectors 154 are longer than the first injectors 152. Therefore, an interval between the first injectors 152 and the peripheral portion of the wafer is shorter than an interval between the second injectors 154 and the central portion of the wafer. Accordingly, the amount of the gas supplied by the second injectors 154 to the central portion of the wafer 140 is more than the amount of the gas supplied by the first injectors 152. The first injectors 152 are disposed in parallel with the second injectors 154. At least one of the first injectors 152 and at least one of the second injectors 154 form at least one injector unit. A plurality of injector units is disposed along the inside of the reaction chamber at uniform intervals. The gas-supplying unit 150 has a plurality of the injector units. The first injectors 152 and the second injectors 154 supply different gases according to a kind of the thin film deposited on the wafer 140 into the reaction chamber 110, or the first injectors 152 and the second injectors 154 may supply substantially the same gas.

In an exemplary embodiment of the present invention, the gas supplied into the reaction chamber 110 comprises a source gas for forming the thin film on the wafer 140, a process gas for improving the characteristics of the thin film and a stabilizing gas for removing contaminant particles from the process gas. The source gas is selected according to a kind of the thin film formed on the wafer 140. For example, in order to form a silicon oxide layer and a silicon nitride layer on the wafer 140, a silicon-containing gas and an oxygen-containing gas and a silicon-containing gas and a nitrogen containing gas are used, respectively. Also, the source gases may be divided into two parts according to kinds of the source gases respectively, and each part of the source gases may be supplied into the first injectors 152 and the second injectors 154, respectively. When molecules of the source gas react well with each other at room temperature, the molecules of the source gas are supplied in different ways. For example, in order to form a silicon oxide layer, silane (SiH$_4$) and oxygen (O$_2$) are used as the source gas. The silane and the oxygen react well with each other at room temperature.

The process gas etches the contaminant particles by an ion impact of plasma reaction. The process gas is selected according to the kind of the thin film formed on the wafer 140 and a process condition. For example, in order to remove contaminant particles such as silicon or silicon oxide that deteriorates the characteristics of the thin film, a fluorine-containing gas is chosen as the process gas.

The stabilizing gas stabilizes the process gas. A gas suitable for removing the contaminant particles from the ion impact of the process gas is selected. For example, when trifluoro-nitrogen (NF$_3$) is used as the process gas, a hydrogen-containing gas is used to remove fluorine from trifluoro-nitrogen (NF$_3$). Not only does the fluorine improve the characteristics of the thin film, but the fluorine also etches the thin film non-uniformly, thereby enhancing uniformity of the thin film. When hydrogen is used, the fluorine in the reaction chamber 110 forms hydrogen fluoride that can be removed effectively.

When the wafer 140 is placed on the electrostatic chuck 120, the gases are supplied into the reaction chamber 110. The gases comprise the source gas as the first gas for forming the thin film on the wafer 140, the process gas as the second gas for improving the characteristics of the thin film and the stabilizing gas as the third gas for stabilizing the contaminant particles from the process gas to remove.

When the gases are supplied into the reaction chamber 110, a radio frequency voltage is supplied through a radio frequency coil 182 and the electrostatic chuck to form gaseous plasma in the reaction chamber 110. The thin film is formed on the wafer 140 from the plasma of the source gas. The contaminant particles may be formed from the plasma of the source gas. The contaminant particles deteriorate gap-filling properties of the thin film, for example, the contaminant particles form voids in the thin film formed on the wafer 140. The contaminant particles are reduced when the process gas is supplied into the reaction chamber apart from the wafer. That is, damage by the contaminant particles is reduced, when a length of the first injector 152 is reduced and the process gas is supplied to the wafer 140 through the reduced first injectors 152. However, the first injectors 152 may inject the source gas for forming the thin film as well as the process gas.

In the case of an apparatus for depositing the thin film having predetermined length of the injectors for depositing the thin film uniformly on the wafer 140, as a length of the first injectors 152 is shortened, the thin film having a relatively lower thickness is deposited on the central portion of the wafer 140. The second injectors 154 being relatively longer than the first injectors 152 improves the uniformity of the thickness of the thin film. The source gases injected through the second injectors 154 being relatively longer than the first injectors 152 are concentrated on the central portion of the wafer 140 to deposit relatively more thickly in the central portion of the wafer 140 than a peripheral portion of the wafer 140. Therefore, the thin film is deposited uniformly on the wafer.

In an exemplary embodiment of the present invention, the gas-supplying unit 150 includes a plurality of injector units. At least one of the first injectors 152 and at least one of the second injectors 154 form at least one injector unit. A plurality of injector units is disposed on the inside of the reaction chamber 110. An interval between at least one of the first injector 152 and the peripheral portion of the wafer 140 is shorter than an interval between the second injectors 154 and the central portion of the wafer 140.

Figure 8:
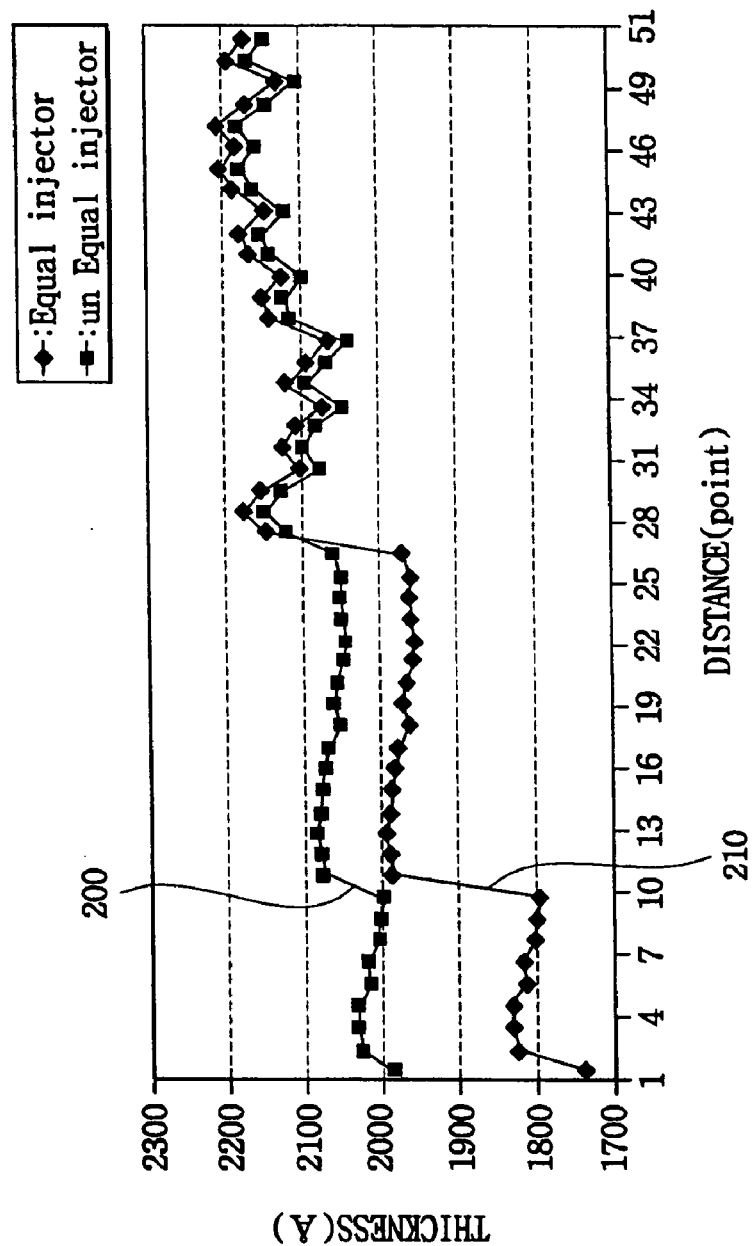
FIG. 8 is a graph illustrating uniformity of the thin film formed on the wafer using the apparatus of FIG. 6.

FIG. 8 is a graph illustrating uniformity of the thin film formed on the wafer using the apparatus of FIG. 6.

Referring to FIG. 8, when the first injectors and the second injectors having different lengths than the first injectors are used, the thin film is then deposited more uniformly compared to using the first injectors and the second injectors having substantially the same lengths as the first injectors. In FIG. 8, the horizontal axis represents the interval between the central portion of the wafer and the peripheral portion of the wafer and the vertical axis represents the thickness of the thin film deposited on the wafer.

When the thin film is formed using the first injectors and the second injectors having different lengths than the first injectors 200, the thickness of the thin film in the central portion of the wafer (point 1) has a larger variance than a thickness of the thin film using the first injectors and the second injectors having substantially the same lengths 210. The thickness of the thin film of the central portion of the wafer (point 1) using the injectors of substantially the same lengths 210 was about 1,750 Å, but the thickness of the thin film of the central portion of the wafer using the first injectors and the second injectors having different length from the first injectors was about 1,980 Å. A difference of the thickness between the thin films decreases in the peripheral portion of the wafer (point 49). When the injectors 210 having the substantially same length were used, the maximum difference of the thickness between the films deposited on the wafer was about 400 Å. However, when the first injectors and the second injectors having different length from the first injectors were used, the maximum difference of the thickness between the films deposited on the wafer was about 200 Å.

According to an exemplary embodiment of the present invention, when the first injectors and the second injectors having different length than the first injectors were used, the uniformity of the thickness of the thin film deposited on the wafer increased by about 50% compared with that of the conventional case. That is, the gas is supplied to deposit the thin film uniformly. A flow rate of the gas at a central portion of a semiconductor substrate is greater than the flow rate at a peripheral portion of the semiconductor substrate.

Figure 9:
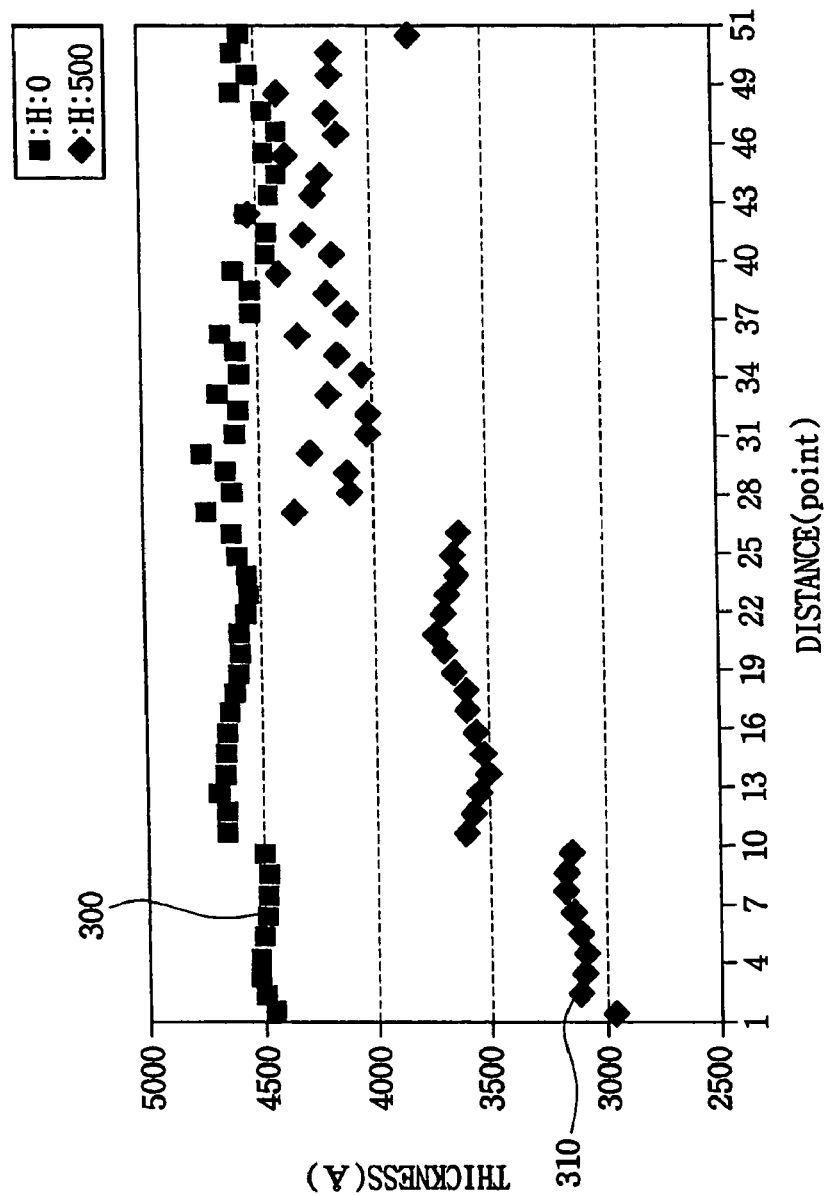
FIG. 9 is a graph illustrating uniformity of the thin film formed on the wafer according to another exemplary embodiment of the present invention.

FIG. 9 is a graph illustrating uniformity of the thin film formed on the wafer according to another exemplary embodiment of the present invention. In FIG. 9, the horizontal axis represents the interval between the central portion of the wafer and the peripheral portion of the wafer and the vertical axis represents the thickness of the thin film deposited on the wafer.

Referring to FIGS. 6, 7 and 9, according to another exemplary embodiment of the present invention, the apparatus for depositing a thin film comprises a reaction chamber 110 in which a plasma is generated, a wafer holder 130 disposed in the reaction chamber 110 for supporting a wafer 140, and gas-supplying unit 150 disposed in the reaction chamber 110 for supplying gases into the reaction chamber 110. The gas-supplying unit 150 supplies a first gas for forming a thin film on the wafer 140, a second gas for improving characteristics of the thin film and a third gas for stabilizing the second gas into the reaction chamber 110.

The gas-supplying unit 150 comprises a first injector 152 and a second injector 154. The first injector 152 supplies the reaction chamber 110 with a gas such as the first gas, the second gas and the third gas. The second injector 154 supplies the reaction chamber 110 with a gas such as the first gas, the second gas and the third gas.

A plurality of the first injectors 152 and a plurality of the second injectors 154 form at least one injector unit. The first injectors 152 are disposed in parallel to the second injectors 154. That is, an interval between the first injectors 152 and the wafer 140 is narrower than an interval between the second injectors 154 and the wafer 140.

The first gas supplied into the reaction chamber 110 includes a gas such as a silicon-containing gas, an oxygen-containing gas, a nitrogen-containing gas and an inert gas. The second gas may include a fluorine-containing gas, and the third gas may include a hydrogen-containing gas so as to stabilize the fluorine-containing gas. For example, when the first gas includes a gas such as a silane gas ($SiH_4$), oxygen ($O_2$), nitrous oxygen ($N_2O$), nitrogen ($N_2$), helium (He) and argon (Ar), the second gas includes a trifluoro-nitrogen ($NF_3$) gas, and the third gas includes a hydrogen gas ($H_2$).

When the wafer 140 is placed on an electrostatic chuck 120, the first gas, the second gas and the third gas are supplied into the reaction chamber 110. The first gas, the second gas and the third gas are supplied into the first injectors 152 and the second injectors 154 according to the thin film formed on the wafer 140, respectively. That is, the first gas is supplied from under the reaction chamber 110 to top of the reaction chamber 110. The first gas is supplied to be concentrated on the central portion of the wafer 140. When the gases are supplied, a radio frequency voltage is supplied to a radio frequency coil 182 and the electrostatic chuck 120 to form plasma of the gases in the reaction chamber 110. The thin film is deposited on the wafer 140 from the plasma of the first gas and the second gas. Therefore, contaminant particles from the second gas are reacted with the third gas, and the contaminant particles are stabilized and removed from the reaction chamber. Although the third gas removes the contaminant particles, a portion of the contaminant particles may remain in the reaction chamber 110. The contaminant particles may deteriorate a gap-filling characteristics of the thin film, for example, the contaminant particles form voids in the thin film on the wafer 140. The contaminant particles may be reduced when the second gas is supplied into the reaction chamber apart from the wafer. The second gas causes the contaminant particles. That is, the control of the length of the first injectors 152 and the second injectors 154 may reduce the problems of deteriorating the gap-filling properties.

When lengths of the injectors are constant in order to deposit the thin film uniformly on the wafer 140, as the length of the first injectors 152 is shortened, the thickness of the thin film deposited on the central portion of the wafer 140 is relatively thinner than the thickness of the thin film deposited on the peripheral portion of the wafer 140. However, second injectors 154 that is relatively longer than the first injectors 152 may improve the uniformity of the thickness of the thin film. The source gas injected through the second injectors 154 that is relatively longer than the first injectors 152 is concentrated on a central portion of the wafer 140 to deposit relatively thicker thin film in the central portion of the wafer 140 than a peripheral portion of the wafer 140. Therefore, the thin film deposits uniformly on the wafer 140. That is, according to another exemplary embodiment of the present invention, the problems caused by the contaminant particles are reduced by the control of the lengths of the first injectors 152 and the second injectors 154, and damage of the thin film is minimized by means of the third gas.

Referring to FIG. 9, forming the thin film using a plurality of the first injector, a plurality of the second injector having different lengths from the first injectors and the third gas 300 shows larger difference in the thickness of the thin film in the central portion of the wafer (point 1) than forming the thin film using a plurality of the injectors of substantially the same lengths 310. The thickness of the thin film of the central portion of the wafer (point 1) using the injectors of substantially the same lengths 310 was about 2,900 Å. However, the thickness of the thin film of the central portion of the wafer using the first injectors, the second injectors having different lengths from the first injectors and the third gas 320 was about 4,400 Å. A difference of the thickness between the thin films decreases in the peripheral portion of the wafer (point 49). When the injectors of substantially the same lengths were used, the maximum difference of the thickness between the films deposited on the wafer was about 1,700 Å. However, when the first injectors, the second injectors having different lengths from the first injectors and the third gas 300 were used, the maximum difference of the thickness between the films deposited on the wafer was about 300 Å. That is, according to another exemplary embodiment of the present invention, when the thin film was deposited using the first injectors, the second injectors having different lengths from the first injectors and the third gas, the uniformity of the thin film increased by about 85%.

According to another exemplary embodiment of the present invention, the thin film having uniform thickness may be deposited using the first injectors, the second injectors having different lengths from the first injectors and the third gas. That is, the uniformity of the thin film is increased as well as the thickness of the thin film is controlled easily by using a plurality of the injectors having different lengths with each other.

In another exemplary embodiment of the present invention, at least one of the first injectors 152 and at least one of the second injectors 154 form at least one injector unit, and a plurality of injector units are disposed along the inside of the reaction chamber with uniform intervals. The gas-supplying unit 150 has a plurality of the injectors unit. An interval between the first injectors 152 and the peripheral portion of the wafer 140 is preferably shorter than an interval between the second injectors 154 and the central portion of the wafer 140. Accordingly, more gas is supplied to the central portion of the wafer 140 than the peripheral portion of the wafer 140. The contaminant particles formed from the gas for improving the characteristics of the thin film are transformed into stable compound to deposit the thin film having uniform thickness on the wafer.

Figure 10:
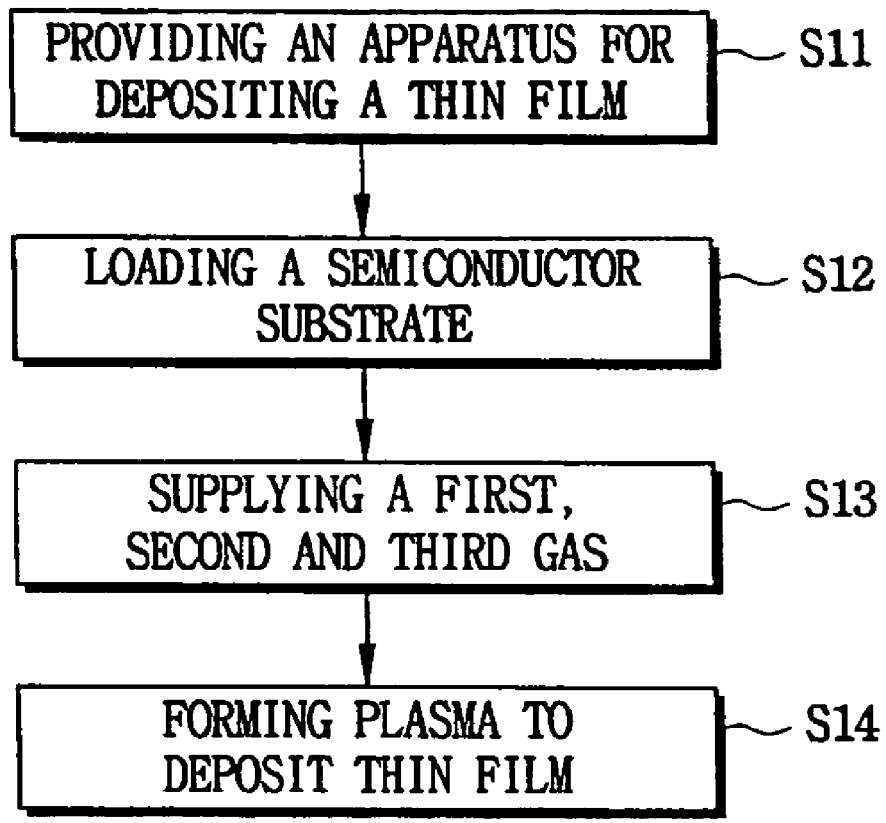
FIG. 10 is a flowchart illustrating a method of forming a thin film according to another exemplary embodiment of the present invention.
Figure 11:
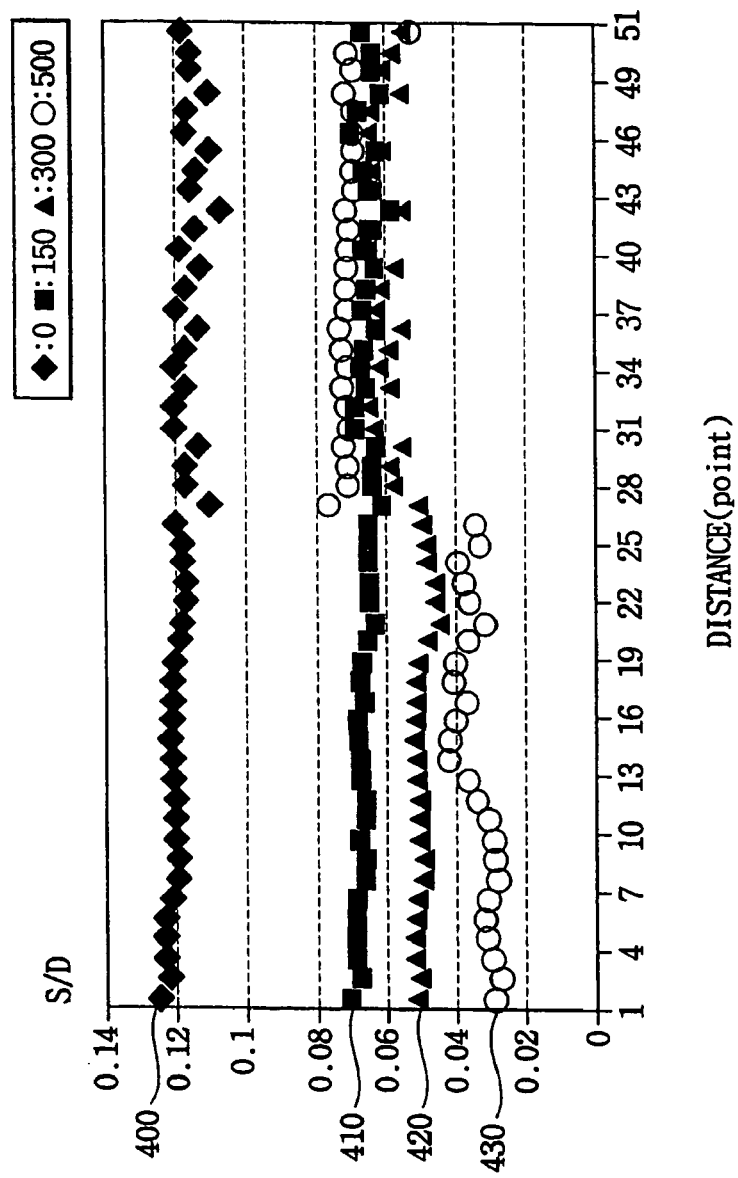
FIG. 11 is a graph illustrating characteristics of the thin film formed on the wafer according to another exemplary embodiment of the present invention.

FIG. 10 is a flow chart illustrating a method of forming a thin film according to another exemplary embodiment of the present invention, and FIG. 11 is a graph illustrating characteristics of the thin film formed on the wafer according to another exemplary embodiment of the present invention.

Referring to FIGS. 10 and 11, a plasma reaction chamber and a gas-supplying unit are disposed in an apparatus for depositing a thin film (step S11). A semiconductor substrate is then loaded in the reaction chamber (step S12). A first gas for depositing the thin film on the semiconductor substrate, a second gas for improving a characteristic of the thin film and a third gas for stabilizing the second gas are then supplied into the reaction chamber sequentially or simultaneously (step S13). Plasma of the first gas and the second gas is formed in the reaction chamber to form the thin film on the semiconductor substrate (step S14).

In order to form an oxide layer or a nitride layer on the semiconductor substrate, the first gas includes a gas such as a silicon-containing gas, an oxygen-containing gas, a nitrogen-containing gas and an inert gas. The second gas includes a fluorine-containing gas. The third gas includes a hydrogen-containing gas that may react with the fluorine-containing gas. For example, when the first gas includes a gas such as a silane gas ($SiH_4$), oxygen ($O_2$), nitrous oxygen ($N_2O$), nitrogen ($N_2$), helium (He) and argon (Ar), the second gas includes a trifluoro-nitrogen ($NF_3$) gas, and the third gas includes a hydrogen gas ($H_2$). The first gas is selected according to a kind of the thin film formed on the wafer 140. The second gas has similar characteristics to an etching gas for improving the characteristics of the thin film formed on the semiconductor substrate.

When the semiconductor substrate is loaded into the reaction chamber, the gases are supplied into the reaction chamber. That is, the first gas for forming the thin film, the second gas for improving the characteristics of the thin film, and the third gas for stabilizing contaminant particles formed from the second gas to remove the contaminant particles are supplied. When the gases are supplied, a radio frequency voltage is applied to the radio frequency coil and an electrostatic chuck disposed in the reaction chamber to form plasma of the gases in the reaction chamber. The thin film is deposited on the semiconductor substrate from the plasma of the first gas and the second gas. The contaminant particles may be formed from the plasma of the second gas. The contaminant particles form voids. Therefore, the contaminant particles hinder a gap-fill by means of the thin film. The contaminant particles formed from the second gas are transformed into different compounds using the third gas to reduce the problems of the contaminant particles. For example, when the first gas includes silane ($SiH_4$), oxygen ($O_2$) and helium (He), the second includes trifluoro-nitrogen ($NF_3$), and the third gas includes hydrogen ($H_2$), a silicon oxide layer is formed on the semiconductor substrate. A reaction between the gases is shown in formula 1.

$$SiH_4+O_2=SiO_2+2H_2 \qquad \text{Formula 1}$$

Fluorine radicals are formed from the second gas, and the fluorine compounds remain in the reaction chamber to deteriorate the characteristics of the thin film. The fluorine compounds are changed into different compounds as shown by the following exemplary formula 2.

$$SiH_4+O_2=SiO_2+2H_2 \qquad \text{Formula 2}$$

$$2NF_3+3H_2=N_2+6HF_2$$

Generally, as the semiconductor device becomes highly integrated, intervals between patterns formed on the semiconductor substrate are shortened, and the height of the patterns is increased. The intervals between the patterns are the intervals between individual elements or metal patterns, or a width of shallow trench isolation (STI). As the aspect ratio (length/width) of the pattern of the thin film increases, deposition of the thin film becomes more difficult. In an HDP-CVD, the deposition of the thin film and the etching of the thin film are performed simultaneously. When the width of the patterns of the semiconductor substrate is narrow, the thin film formed on the patterns is etched by means of the plasma. Therefore, the thin film is redeposited to form voids in the thin film deposited on the patterns. When hydrogen is added to the gases, both the etching of the thin film by the plasma and the redeposition rate decrease. As the redeposition rate decreases, bias power may increase and the characteristics of the thin film may be improved.

In FIG. 11, the horizontal axis represents the interval between the central portion of the wafer and the peripheral portion of the wafer, and the vertical axis represents the deposition rate according to a sputter rate (S/D). Here, the sputter rate is the etching rate.

Referring to FIG. 11, when the S/D increases, the thin film may be over-etched to cause redeposition. The S/D of the central portion of the semiconductor substrate (point 1) was about 0.13 without the third gas (denoted by reference numeral 400). However, when a flow rate of the third gas was between about 150 sccm and about 500 sccm, the S/D of the central portion of the semiconductor substrate (point 1) decreases. The decrease of the S/D means a proportional decrease of the thin film etched, when the substantially same amount of the thin film is deposited.

When the flow rate of the third gas was about 150 sccm (denoted by reference numeral 410), the S/D of the central portion of the semiconductor substrate (point 1) was about 0.07. Therefore, when the flow rate of the third gas was about 150 sccm, the S/D difference between the central portion of the semiconductor substrate (point 1) and the peripheral portion of the semiconductor substrate (point 49) were substantially the same. However, the S/D of the central portion of the semiconductor substrate (point 1) was about a half compared with the case without the third gas.

Also, when the flow rate of the third gas was about 300 sccm (denoted by reference numeral 420), the S/D of the central portion of the semiconductor substrate (point 1) was about 0.05. Therefore, when the flow rate of the third gas was about 300 sccm, the S/D difference between the central portion of the semiconductor substrate (point 1) and the peripheral portion of the semiconductor substrate (point 49) was about 0.02. However, the S/D of the central portion of the semiconductor substrate (point 1) was about two thirds compared with the case without the third gas.

When the flow rate of the third gas was about 500 sccm (denoted by reference numeral 430), the S/D of the central portion of the semiconductor substrate (point 1) was about 0.03. Therefore, the S/D difference between the central portion of the semiconductor substrate (point 1) and the peripheral portion of the semiconductor substrate (point 49) was about 0.05. However, the S/D of the central portion of the semiconductor substrate (point 1) was about five sixths compared with the case without the third gas.

When the S/D without the redeposition was 0.13, the S/D of about 500 sccm was one fourth of the S/D without the redeposition. Therefore, the bias power may be increased by about four times. When bias power increases, the characteristics of the thin film formed on the semiconductor substrate may be improved. However, as the flow rate of the third gas increases, the S/D between the central portion of the semiconductor (point 1) and the peripheral portion of the semiconductor (point 29) also increases. Therefore, the semiconductor substrate is partially over-etched. Referring to FIG. 11, a step of the S/D graph is shown in the middle portion (point 25) disposed between the central portion of the semiconductor substrate and the peripheral portion of the semiconductor substrate. However, the control of the lengths of the first and the second injectors of the gas-supplying unit may reduce the step.

According to the present invention, when the first injectors and the second injectors having different lengths from the first injectors are used, or when the first injectors, the second injectors having different length from the first injectors and a stabilizing gas are used, uniformity of thin film deposited on a wafer is increased. That is, a flow rate of the first gas at a central portion of the semiconductor substrate is greater than at a peripheral portion of the semiconductor substrate, and contaminant particles formed from a gas are transformed to stable compound so as to improve thin film characteristics, thereby depositing the thin film uniformly on the wafer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for forming a thin film comprising:
   a reaction chamber;
   a wafer holder for supporting a wafer, the wafer holder being disposed in the reaction chamber; and
   a gas-supplying unit extended into the reaction chamber, to supply a gas, wherein the flow rate of the supplied gas at the central portion of the wafer is greater than the flow rate of the supplied gas at a peripheral portion of the wafer,
   wherein the gas-supplying unit includes a plurality of first injectors that are positioned to be above the peripheral portion of the wafer and adjacent to the peripheral portion of the wafer and extending into the interior of the reaction chamber, and a plurality of second injectors that are positioned to be above the central portion of the wafer and adjacent to the central portion of the wafer and extending into the interior of the reaction chamber, and
   wherein at least one of the first injectors and at least one of the second injectors grouped with the at least one of the first injectors form at least one injector unit, the grouped at least one of the first injectors and the at least one of the second injectors being adjacent to and parallel with each other, wherein a plurality of injector units are disposed on the inside of the reaction chamber, and wherein the plurality of injector units are positioned to substantially surround the wafer.

2. The apparatus for forming a thin film of claim 1, wherein an interval between the first injector and the peripheral portions of the wafer is shorter than an interval between the second injector and the central portion of the wafer.

3. An apparatus for forming a thin film comprising:
   a reaction chamber;
   a wafer holder for supporting a wafer, the wafer holder being disposed in the reaction chamber; and
   a gas-supplying unit disposed in the reaction chamber to supply a first, a second and a third gas into the reaction chamber, wherein the first gas forms a thin film on the wafer, the second gas improves characteristics of the thin film, and the third gas stabilizes the second gas,
   wherein the gas-supplying unit includes a plurality of first injectors for supplying at least one of the first gas, the second gas and the third gas, wherein the first injectors are positioned to be above a peripheral portion of the wafer and adjacent to the peripheral portion of the wafer, and a plurality of second injectors for supplying at least one of the first gas, the second gas and the third gas, wherein the second injectors are positioned to be above a central portion of the wafer and adjacent to the central portion of the wafer, and
   wherein an injector unit comprises at least one of the first injectors and at least one of the second injectors grouped with the at least one of the first injectors, the grouped at least one of the first injectors and the least one of the second injectors being adjacent to, and parallel with, each other, and wherein a plurality of injector units are positioned along an inner face of the reaction chamber to substantially surround the wafer.

4. The apparatus for forming a thin film of claim 3, wherein the first gas includes at least one gas selected from the group consisting of a silicon-containing gas, an oxygen-containing gas, a nitrogen-containing gas and an inert gas.

5. The apparatus for forming a thin film of claim 4, wherein the second gas includes a fluorine-containing gas and the third gas includes a hydrogen-containing gas.

6. The apparatus for forming a thin film of claim 5, wherein:
   the first gas includes at least one gas selected from the group consisting of a silane gas, an oxygen gas, a nitrous oxygen gas, a nitrogen gas, a helium gas and an argon gas;
   the second gas includes a trifluoro-nitrogen gas; and
   the third gas includes a hydrogen gas.

7. The apparatus for forming a thin film of claim 3, wherein an interval between the first injectors and the peripheral portion of the wafer is shorter than an interval between the second injectors and the central portion of the wafer.

* * * * *